United States Patent
Szkopek et al.

(10) Patent No.: US 12,453,014 B2
(45) Date of Patent: Oct. 21, 2025

(54) ELECTRONIC CIRCUIT HAVING GRAPHENE OXIDE PAPER SUBSTRATE AND METHOD OF RECOVERING PARTS OF AN ELECTRONIC CIRCUIT

(71) Applicant: THE ROYAL INSTITUTION FOR THE ADVANCEMENT OF LEARNING/MCGILL UNIVERSITY, Montréal (CA)

(72) Inventors: Thomas Szkopek, Outremont (CA); Anthony Ubah, Windsor (CA); Marta Cerruti, Montreal (CA)

(73) Assignee: THE ROYAL INSTITUTION FOR THE ADVANCEMENT OF LEARNING / MCGILL UNIVERSITY, Montreal (CA)

( * ) Notice: Subject to any disclaimer, the term of this patent is extended or adjusted under 35 U.S.C. 154(b) by 353 days.

(21) Appl. No.: 17/794,026

(22) PCT Filed: Jan. 22, 2021

(86) PCT No.: PCT/CA2021/050066
§ 371 (c)(1),
(2) Date: Jul. 20, 2022

(87) PCT Pub. No.: WO2021/146810
PCT Pub. Date: Jul. 29, 2021

(65) Prior Publication Data
US 2023/0049337 A1    Feb. 16, 2023

Related U.S. Application Data

(60) Provisional application No. 62/964,903, filed on Jan. 23, 2020.

(51) Int. Cl.
*D21H 13/46* (2006.01)
*H05K 1/03* (2006.01)
*H05K 3/22* (2006.01)

(52) U.S. Cl.
CPC ............... *H05K 3/22* (2013.01); *D21H 13/46* (2013.01); *H05K 1/0386* (2013.01);
(Continued)

(58) Field of Classification Search
CPC .......... D21C 5/02; D21H 13/46; D21H 27/00; H05K 1/0306; H05K 1/0386; H05K 1/03;
(Continued)

(56) References Cited

U.S. PATENT DOCUMENTS 9,215,813 B2    12/2015    Brosseau et al.
9,681,996 B2    6/2017    Prioleau et al.
(Continued)

FOREIGN PATENT DOCUMENTS

CN    103935994         7/2014
CN    103935994 A  *   7/2014   ........... C01B 32/184
(Continued)

OTHER PUBLICATIONS

Self-Supporting GO Films_ Torris et al._pp. 1-11_Nov. 2018.*
(Continued)

*Primary Examiner* — Timothy J Thompson
*Assistant Examiner* — Guillermo J Egoavil
(74) *Attorney, Agent, or Firm* — Reno Lessard; Norton Rose Fulbright Canada LLP

(57) ABSTRACT

There is described a method of recovering parts of an electronic circuit having a self-supporting substrate having graphene oxide (GO) paper, and at least a conductive trace on the self-supporting substrate. The method generally has a step of immersing the electronic circuit into an environment-friendly solvent, the GO paper thereby dissociating from the
(Continued)

conductive trace; and a step of recovering the GO paper from the environment-friendly solvent. The present disclosure also describes an electronic circuit generally having a self-supporting substrate having GO paper with a structural thickness being equal or above a given thickness threshold; and at least a conductive trace on said self-supporting substrate. Further, there is also described a substrate for an electronic circuit in which the substrate generally has a self-supporting substrate having GO paper with a structural thickness being equal or above a given thickness threshold.

6 Claims, 8 Drawing Sheets

(52) U.S. Cl.
CPC ............... *H05K 2203/0776* (2013.01); *H05K 2203/0786* (2013.01); *H05K 2203/178* (2013.01)

(58) Field of Classification Search
CPC ... H05K 2203/0776; H05K 2203/0786; H05K 2203/178; H05K 3/22; Y02W 30/64
USPC ........................................................ 174/255

See application file for complete search history.

(56) References Cited

U.S. PATENT DOCUMENTS

| | | | |
|---|---|---|---|
| 2010/0323177 A1* | 12/2010 | Ruoff | B32B 9/04 |
| | | | 428/688 |
| 2014/0050910 A1* | 2/2014 | Mukherjee | C01B 32/192 |
| | | | 428/221 |
| 2017/0261854 A1* | 9/2017 | Yamazaki | C08L 79/02 |
| 2019/0197264 A1 | 6/2019 | Allen et al. | |
| 2020/0096869 A1* | 3/2020 | Ma | G03F 7/2016 |

FOREIGN PATENT DOCUMENTS

| | | | | |
|---|---|---|---|---|
| CN | 105776185 | | 7/2016 | |
| CN | 107703196 A | * | 2/2018 | ........... G01N 27/308 |

OTHER PUBLICATIONS

GO From Fundamental to Application_Perrozzi et al_pp. 1 to 21_Nov. 2014.*
GO From Fundamental to Application_Perrozzi et al._pages 1 to 21_Nov 2014.*
Self-Supporting GO Films_ Torris et al._pages 1-11_Nov 2018.*
Park, Rowoon et al. "One-Step Laser Patterned Highly Uniform Reduced Graphene Oxide Thin Films for Circuit-Enabled Tattoo and Flexible Humidity Sensor Application." Sensors (Basel, Switzerland) vol. 18,6 1857. Jun. 6, 2018.
Das, Suprem R et al. "Superhydrophobic inkjet printed flexible graphene circuits via direct-pulsed laser writing." Nanoscale vol. 9,48 (2017).

* cited by examiner

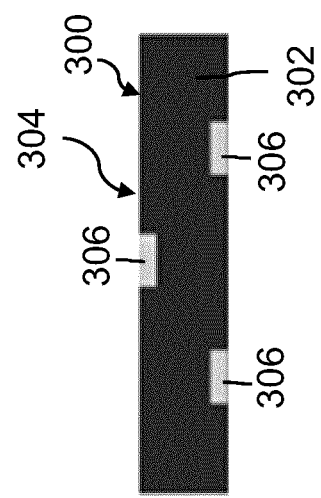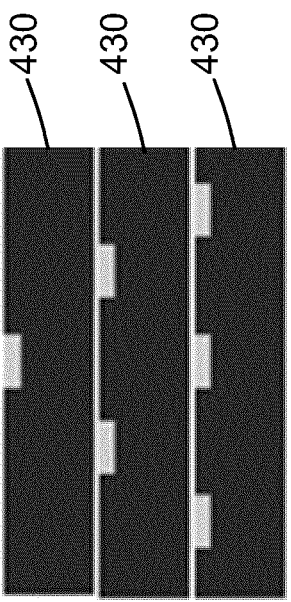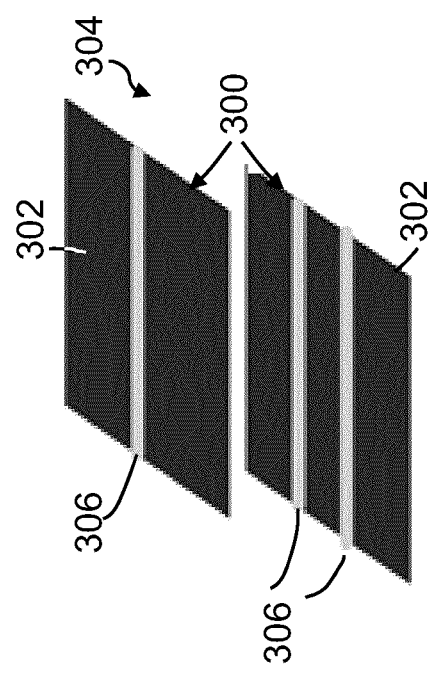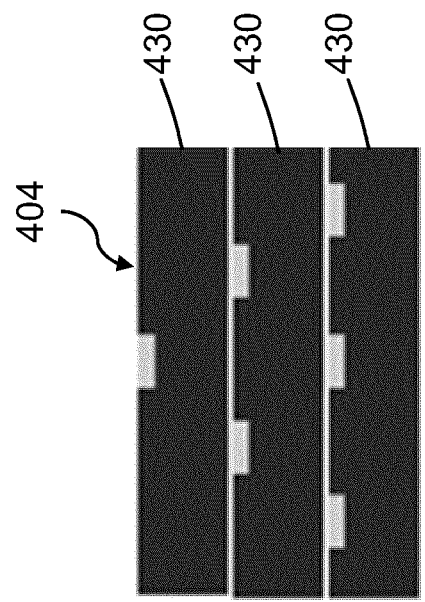
Fig. 5B
Fig. 6B
Fig. 5A
Fig. 6A

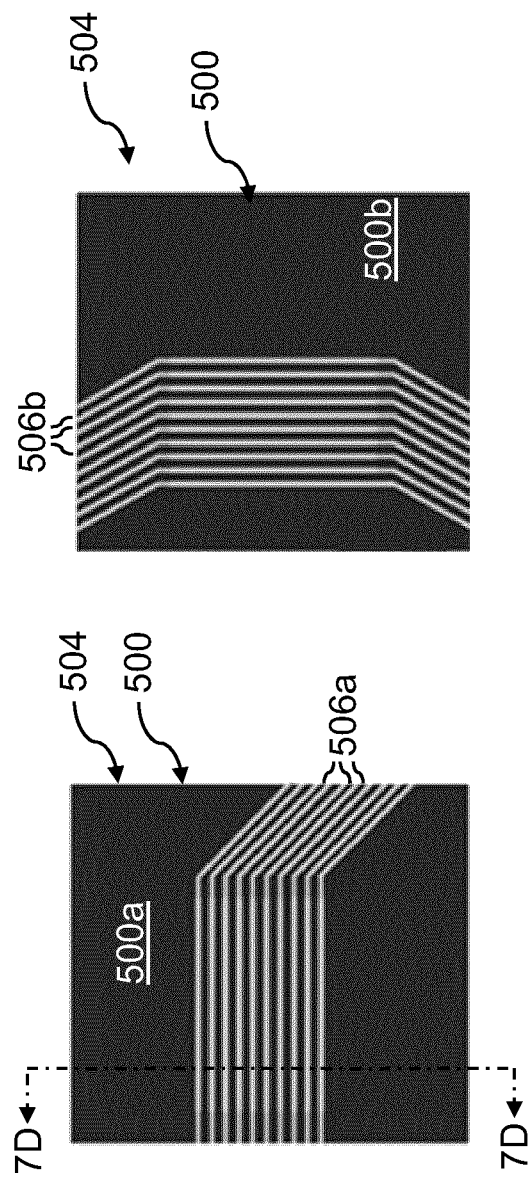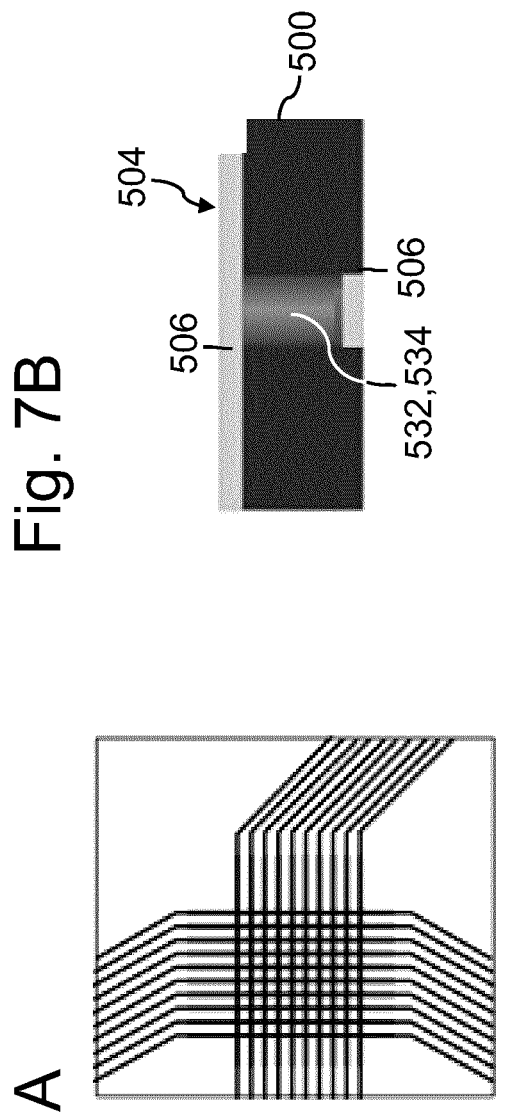
Fig. 7A
Fig. 7B
Fig. 7C
Fig. 7D

ELECTRONIC CIRCUIT HAVING GRAPHENE OXIDE PAPER SUBSTRATE AND METHOD OF RECOVERING PARTS OF AN ELECTRONIC CIRCUIT

FIELD

The improvements generally relate to electronic circuits and more particularly relate to electronic circuits comprising graphene oxide paper.

BACKGROUND

Graphene oxide (GO) paper is a material consisting of superposed layers of oxidized graphene. In terms of physical properties, GO paper is a material generally known as exhibiting high ultimate tensile strength, high stiffness, low mass density, and high visco-elastic damping. Thanks to its oxidized composition, GO paper is also a highly insulating dielectric material. Thin layers of GO have been considered as additive layers atop electronic circuit substrates. In some studies, a polymer piece is used as a structural support to such thin layers of GO to form an electronic circuit substrate with GO as a constituent element. Although such polymer supported GO electronic circuit substrates have been found to be satisfactory to a certain degree, there remains room for improvement.

SUMMARY

It was found that there was an incentive in the electronic circuit industry to benefit from the above-mentioned desirable physical properties of GO paper while avoiding the use of a structural, supporting polymer piece. For instance, as the thin layer of GO is supported on the polymer piece, recovery of the GO, conductive trace(s) and/or electronic component(s) has been found to be difficult and even impossible in at least some situations.

In an aspect, there is thus described a GO paper-based electronic circuit substrate allowing convenient recovery and re-use of the GO paper, the conductive trace(s) and/or the electronic component(s). More specifically, it was found that by providing a GO paper substrate having a structural thickness, the supporting polymer piece can be omitted, thereby allowing recovery of any of the components of the electronic circuit after its lifetime.

In accordance with a first aspect of the present disclosure, there is provided a method of recovering parts of an electronic circuit having a self-supporting substrate having graphene oxide (GO) paper and at least a conductive trace on said self-supporting substrate, the method comprising: immersing said electronic circuit into an environment-friendly solvent, said GO paper thereby dissociating from said conductive trace; and recovering at least one of said conductive trace and said GO paper from said environment-friendly solvent.

Further in accordance with the first aspect of the present disclosure, said immersing said electronic circuit into an environment-friendly solvent can for example comprise immersing said electronic circuit into water.

Still further in accordance with the first aspect of the present disclosure, said immersing can for example comprise said conductive trace settling to a bottom layer of said environment-friendly solvent and said GO paper forming a suspension within an upper layer of said environment-friendly solvent.

Still further in accordance with the first aspect of the present disclosure, said recovering can for example comprise isolating said top layer and said bottom layer from one another and removing said at least one of said conductive trace and said GO paper from said environment-friendly solvent.

Still further in accordance with the first aspect of the present disclosure, said recovering can for example comprise evaporating said environment-friendly solvent.

Still further in accordance with the first aspect of the present disclosure, said method can for example further comprise fabricating another electronic circuit using said recovered at least one of said conductive trace and said GO paper.

In accordance with a second aspect of the present disclosure, there is provided an electronic circuit comprising: a self-supporting substrate having GO paper with a structural thickness being equal or above a given thickness threshold; and at least a conductive trace on said self-supporting substrate.

Further in accordance with the second aspect of the present disclosure, said given thickness threshold can for example be at least 10 μm.

Still further in accordance with the second aspect of the present disclosure, said given thickness threshold can for example be at least 30 μm.

Still further in accordance with the second aspect of the present disclosure, said structural thickness can for example range between 10 μm and 3000 μm.

Still further in accordance with the second aspect of the present disclosure, said structural thickness can for example range between 30 μm and 300 μm.

Still further in accordance with the second aspect of the present disclosure, said conductive trace can for example be made of reduced graphene oxide (rGO).

Still further in accordance with the second aspect of the present disclosure, said conductive trace can for example be dissociable from said GO paper upon immersing said electronic circuit into an environment-friendly solvent.

In accordance with a third aspect of the present disclosure, there is provided a substrate for an electronic circuit, said substrate comprising: a self-supporting substrate having GO paper with a structural thickness being equal or above a given thickness threshold.

Further in accordance with the third aspect of the present disclosure, said given thickness threshold can for example be at least 10 μm.

Still further in accordance with the third aspect of the present disclosure, said given thickness threshold can for example be at least 30 μm.

Still further in accordance with the third aspect of the present disclosure, said structural thickness can for example range between 10 μm and 3000 μm.

Still further in accordance with the third aspect of the present disclosure, said structural thickness can for example range between 30 μm and 300 μm.

Still further in accordance with the third aspect of the present disclosure, said GO paper can for example be solvable in an environment-friendly solvent. In accordance with a fourth aspect of the present disclosure, there is provided a use of GO paper as a substrate for an electronic circuit, said substrate having said GO paper with a structural thickness being equal or above a given thickness threshold.

In accordance with a fifth aspect of the present disclosure, there is provided a method of manufacturing an electronic circuit, the method comprising: forming a self-supporting substrate of graphene oxide (GO) paper; and reducing the oxygen content of portions of said GO in one or more predetermined patterns to form one or more conductive traces running on said self-supporting substrate.

Further in accordance with the fifth aspect of the present disclosure, said reducing can for example comprise chemical reduction step(s), thermal reduction step(s), photoreduction step(s), or any combination thereof.

Many further features and combinations thereof concerning the present improvements will appear to those skilled in the art following a reading of the instant disclosure.

DESCRIPTION OF THE FIGURES

In the Figures,

FIG. 5A is an oblique view of an example of an electronic circuit having a self-supporting substrate having GO paper and conductive traces on each side of the self-supporting substrate, in accordance with one or more embodiments;

FIG. 5B is a sectional view of the electronic circuit of FIG. 5A, in accordance with one or more embodiments;

FIG. 6A is an oblique view of three exemplary electronic circuit layers each having a self-supporting substrate having GO paper and one or more conductive traces thereon, in accordance with one or more embodiments;

FIG. 6B is a sectional view of an example of an electronic circuit incorporating the three exemplary electronic circuit layers of FIG. 6A, showing the electronic circuit layers being superposed to one another, in accordance with one or more embodiments;

FIG. 7A is a top plan view of an example of an electronic circuit having a self-supporting substrate having GO paper and conductive traces on a first side thereof, in accordance with one or more embodiments;

FIG. 7B is a bottom plan view of the electronic circuit of FIG. 7A, showing conductive traces on a second side of the self-supporting substrate, in accordance with one or more embodiments;

FIG. 7C is a schematic view of the conductive traces of the first side of the self-supporting substrate overlaid to the conductive traces of the second side, in accordance with one or more embodiments;

FIG. 7D is a sectional view of the electronic circuit of FIG. 7A, taken along line 7D-7D of FIG. 7A, in accordance with one or more embodiments;

DETAILED DESCRIPTION

Figure 1:
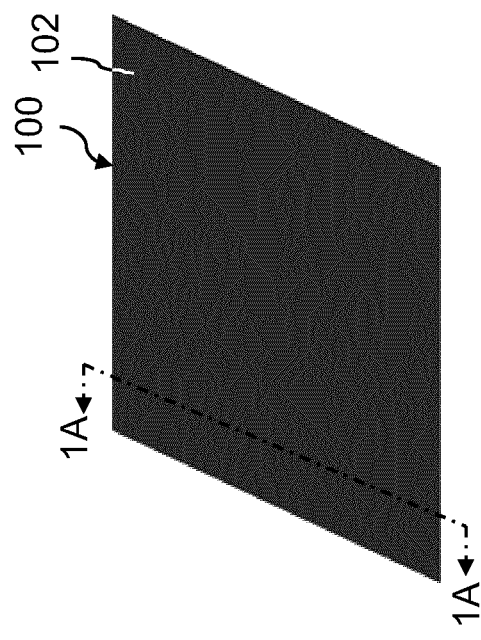
FIG. 1 is an oblique view of an example of a self-supporting substrate having GO paper, in accordance with one or more embodiments.

FIG. 1 shows an example of a self-supporting substrate 100 for an electronic circuit, in accordance with an embodiment. As depicted, the self-supporting substrate 100 has graphene oxide (GO) paper 102, i.e., oxidized graphene oxide or graphene oxide composite layers superposed to one another. It is intended that the self-supporting substrate 100 assumes both the mechanical support and the dielectric functionality that are required of a satisfactory electronic circuit substrate. The GO paper 102 can be manufactured into the self-supporting substrate 100 by a variety of known methods, such as drop casting and air-drying or vacuum filtration to name a few examples. A variety of additives may be added for tuning the cross-linking between GO sheets that compose the GO paper 102. Additives in the GO paper 102 can be used to tune mechanical, thermal, electrical, optical or chemical properties as desired for one or more applications. The self-supporting substrate 100 can be provided in a rigid, semi-rigid, or flexible form, depending on the embodiment.

Figure 1A:
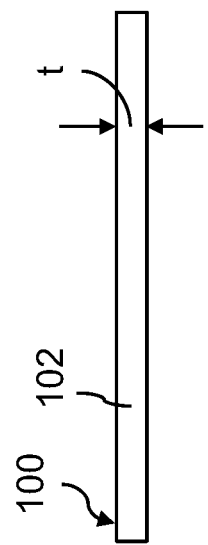
FIG. 1A is a cross-sectional view of the self-supporting substrate of FIG. 1, taken along section 1A-1A of FIG. 1, in accordance with one or more embodiments.

As best seen in FIG. 1A, the self-supporting substrate 100 has a structural thickness t being equal or above a given thickness threshold $t_{thres}$, i.e., $t \geq t_{thres}$. It is envisaged that the structural thickness t of the self-supporting substrate 100 can vary from one embodiment to another. However, the structural thickness t of the self-supporting substrate 100 is such that the GO paper 102 can be used as a substrate for an electronic circuit by itself, without any supporting piece of another material acting as structure. In some embodiments, the given thickness threshold $t_{thres}$ is at least 10 µm, and preferably at least 30 µm. The given thickness threshold $t_{thres}$ can even exceed 30 µm in some other embodiments. In some embodiments, the structural thickness t of the self-supporting layer 100 can range between 10 µm and 3000 µm, and preferably between 30 µm and 300 µm. However, it is noted that the structural thickness t can exceed 3000 µm in at least some embodiments.

Figure 2:
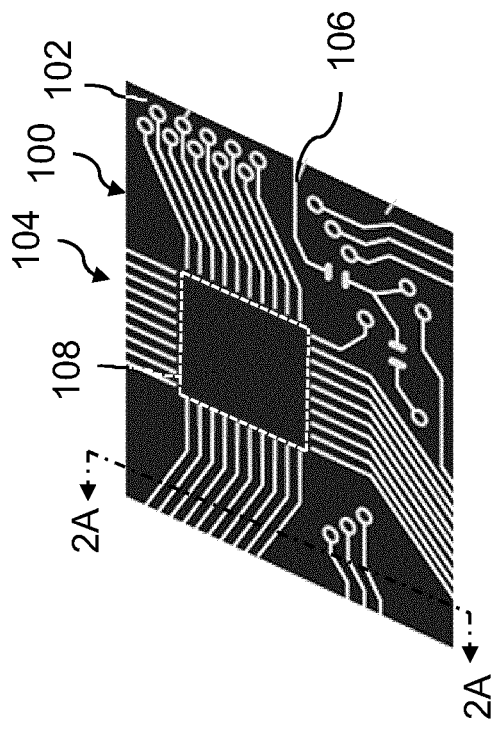
FIG. 2 is an oblique view of an example of an electronic circuit comprising the self-supporting substrate of FIG. 1 and conductive traces thereon, in accordance with one or more embodiments.
Figure 2A:
FIG. 2A is a cross-sectional view of the electronic circuit of FIG. 2, taken along section 2A-2A of FIG. 2, in accordance with one or more embodiments.

FIGS. 2 and 2A show an example of an electronic circuit 104 incorporating the self-supporting substrate 100 and having conductive traces 106 on the self-supporting substrate 100. The conductive traces 106 can be mounted, integrated or otherwise formed on or within the self-supporting substrate 100 with the purpose of establishing electrical conduction and connectivity, taking the form of low electrical resistance traces for low-frequency (f<1 MHz) transmission of electrical signals or electrical power and/or transmission lines or waveguide structures for high-frequency (f>1 MHz) transmission of electrical signals or electrical power. Examples of the conductive traces 106 can include, but not limited to, microstrip lines, slot-lines, coplanar waveguides and other structures commonly used for high frequency signal or power transmission.

As best seen in FIG. 2, some of the conductive traces 106 lead to an electronic component receiving region 108, where an electronic component is expected to be electrically connected. It is envisaged that the electronic circuit 104 can have a number of electronic components can be mounted, integrated or otherwise formed on the self-supporting substrate 100 and electrically connected to one another via the conductive traces 106. Examples of such electronic components can include lumped-element, distributed circuit components, couplers, attenuators, power splitters, and other high-frequency circuits. These resistors may be used as heating elements where Ohmic conduction gives rise to Joule heating. These resistors may be used for sensing. Chemo-resistivity, thermo-resistivity, piezo-resistivity, and opto-resistivity can be used to transduce chemical, thermal, mechanical and optical input into a modulated resistance useful for electrical detection of external stimuli. These resistors may also serve an electrical function, providing a means to have a linear relation between electrical current and voltage. Other examples of electronic components can include inductors, capacitors, coupled inductors, transformers, near-field antennas and far-field antennas. Inductors can be implemented by meandering or circuitous conductive traces designed for tuning the induced magnetic flux linkage per unit current. Capacitors can be implemented by arranging conductive traces on the same side or opposite side of the self-supporting substrate, designed for tuning the charge separation per unit voltage. Coupled inductors and transformers consist of multiple inductor structures arranged for mutual magnetic flux linkage. Near-field and far-field antennas consist of conductive traces formed in the geometry and geometries suitable for coupling electromagnetic radiation to terminal current or voltage. The latter can take the form of but is not limited to linear dipole antennas, loop antennas, patch antennas, bow-tie antennas, log-periodic antennas, and antenna arrays in end-fire or broad-side configuration. Other types of electronic components can also be envisaged in other embodiments.

Discrete electronic components can be soldered, or bonded on to the self-supporting substrate 100 using conductive adhesives in some embodiments. The ensemble combines the functionality of the discrete electronic components and integrated conductive traces with the functionality of the self-supporting substrate to create electronic circuits with greater functionality than the individual electronic components.

Figure 3B:
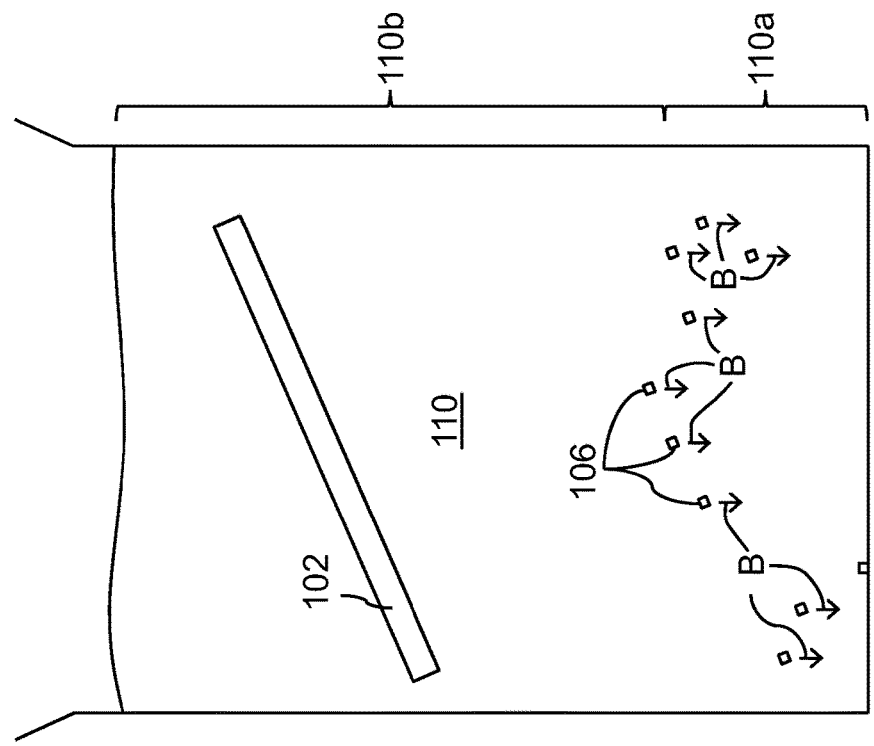
FIG. 3B is a schematic view of the electronic circuit of FIG. 2 being immersed into the environmental-friendly solvent of FIG. 3A, showing the conductive traces dissociating from the self-supporting substrate, in accordance with one or more embodiments.
Figure 3A:
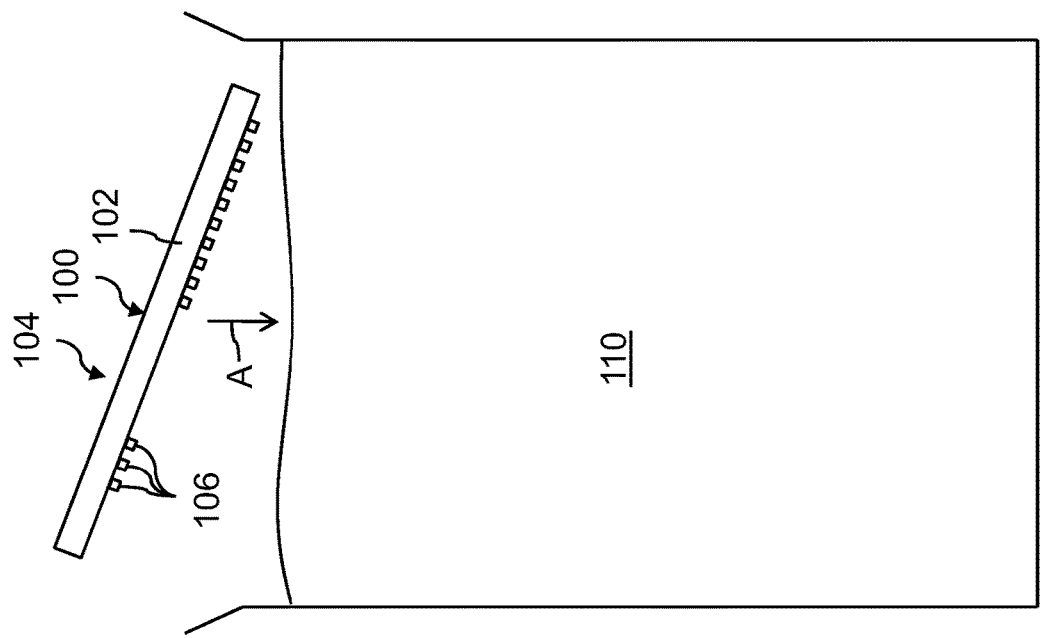
FIG. 3A is a schematic view of the electronic circuit of FIG. 2 prior to immersion into an environmental-friendly solvent, in accordance with one or more embodiments.

It is intended that the conductive trace(s) 106, and thereby any electronic component(s), are dissociable from the GO paper 102 upon immersion into an environment-friendly solvent, such as tap water, water with electrolytes, any other suitable inorganic solvents, and/or any other suitable organic solvents, thanks to an advantageous chemical property of the GO paper 102. Accordingly, the electronic circuit 104 can be separated into its fundamental components in a rather straightforward and eco-friendly manner. The temperature of the environment-friendly solvent can impact the rate at which the conductive trace(s) 106 and/or electronic component(s) may dissociate from the GO paper 102. For instance, in an experiment performed using tap water, the warmer the tap water was, the quicker the dissolution step could be performed. For instance, warm tap water at a temperature of about 69 degrees Celsius was found to be satisfactory to achieve a convenient dissolution rate. As such, there is described a method of recovering parts of the electronic circuit 104. More specifically, there is described a method of recovering the GO paper 102, the conductive trace(s) 106 and/or the electronic component(s), if any, from the electronic circuit 104. As shown in FIG. 3A, the method has a step of immersing the electronic circuit 104 into an environment-friendly solvent 110, as schematically illustrated via arrow A. As shown in FIG. 3B, as the electronic circuit 104 is immersed in the environmental-friendly solvent 110, the GO paper 102 dissociates from the conductive traces 106, and the electronic components, if any, as schematically shown via arrows B. Although the GO paper 102 is shown to maintain its shape in the illustrated example, the GO paper 102 can dissolved into a multitude of GO sheets or flakes that collectively form the GO paper 102 when immersed into the environment-friendly solvent 110. After such a dissociation, the method includes a further step of recovering the GO paper 102, the conductive traces 106 and/or the electronic component(s) from the environment-friendly solvent 110. As can be appreciated, hazardous acidic solvent(s) typically used to dissociate metallic components from printed circuit boards can be omitted with the suggested method, thereby providing an eco-friendly alternative in the field of electronic circuit recycling.

As shown in the specific embodiment of FIG. 3B, in the step of immersing, the conductive traces 106, and electronic components if any, can settle to a bottom layer 110a of the environment-friendly solvent 110 whereas the GO paper 110 can form a suspension within an upper layer 110b of the environment-friendly solvent 110. In such embodiments, the step of recovery can include a step of isolating the bottom and upper layers 110a and 110b from one another, and a step of removing the GO paper 100 from the environment-friendly solvent 110. In some embodiments, the step of recovery can include a step of evaporating the environment-friendly solvent 110, thereby freeing the GO paper 102, the conductive traces 106 and/or the electronic components. It is noted that the above-mentioned steps can be performed by a human operator, or by one or more robotic stations of a production line, in some embodiments. Where it is convenient or advantageous to re-use the recovered components, the method can also include a step of fabricating another electronic circuit using the recovered components.

As will be described below, the conductive traces 106 can be made of metal, selectively reduced GO, or a combination thereof.

In embodiments where at least some of the conductive traces 106 are metallic, metal can be printed, deposited or otherwise mounted to the self-supporting substrate 100 in any satisfactory manner. Examples of such metals can include, but not limited to, Cu, Au, Ag, Pd and the like.

In embodiments where at least some of the conductive traces 106 are made of reduced GO (rGO), regions of the self-supporting substrate 100 can be selectively reduced (with reduced oxygen content than in GO) via selective area reduction (SAR), thereby rendering the regions of the GO paper 102 electrically conductive. Such an electronic circuit is referred to as a GO and rGO assembly in the following paragraphs. Such an assembly can be said to be monolithic as it consists only of unreduced and reduced graphene oxide. SAR can be used not only to form some of the conductive traces 106 but also to form a number of electronic components such as interconnects, capacitors, inductors, resistors, transmission lines, waveguides and antennas in some embodiments. The reduction of GO entails the removal of oxygen containing functional groups to partially or wholly recover the hexagonal lattice structure of graphene. Techniques to reduce regions of the GO paper 102 can vary from one embodiment to another. For instance, examples of such reduction can include, but not limited to, optical reduction, thermal reduction, electrical reduction, chemical reduction, any other suitable existing reduction technique, or a combination thereof.

For instance, chemical reduction is a method of reduction that relies on chemical reducing agents to eliminate oxygen functional groups. The functional groups containing oxygen react more readily with the reducing agents, creating free molecular species containing elements from the functional group. There are a wide variety of reducing agents that can be utilized. Selection of reducing agent often amounts to which functional group is targeted for removal. Certain reducing agents react more readily with one species of functional group than others. For example, borohydrides will more often reduce carbonyl functional groups. In this way, chemical selective reduction entails removing only particular functional groups. Other chemical reducing agents include aluminum hydrides, hydrohalic acids, alcohols, metals acids and even microorganisms, such as baker's yeast.

Thermal reduction is a method of reduction that relies on heating the GO sample under carbon-inert atmospheric conditions (e.g. ultra-high vacuum, argon, ammonia) to inhibit formation of new functional groups. Thermal reduction, unlike chemical reduction, allows for a higher degree of control over the final carbon to oxygen (C/O) ratio of the resulting rGO. The primary mechanism behind thermal reduction of GO is the dissociation of functional group with thermal energy elevated above that at room temperature.

Photoreduction is a method of reduction that uses electromagnetic radiation, most often in the ultra-violet, visible, and/or infra-red spectral regions, to eliminate functional groups. This method of reduction is often hailed as 'green' due to its lack of chemical agents and it's speed. The microscopic mechanisms in the process of photoreduction vary depending on the conditions of reduction. Mechanisms include solvated electron interactions and thermal reduction induced by optical energy transfer. Examples of photoreduction include, but are not limited to, laser lithography, flash lamp exposure and microwave exposure.

Hybrid reduction is a method of reduction referring to processes wherein a combination of two or more of the reduction methods listed above are combined.

Such monolithic GO and rGO assemblies can be designed to operate from DC through to radio frequency and microwave frequency bands. Monolithic construction can ease fabrication of a wide array of components on a single self-supporting substrate with a single material system. Such GO and rGO assemblies can be thin and flexible, yet mechanically robust. The GO and rGO assemblies can comprise earth abundant elements, primarily carbon, oxygen, and hydrogen in some embodiments. The physical properties of the above-described GO and rGO assembly, such as Young's modulus, ultimate tensile strength, electrical conductivity, can be tuned during the manufacturing process by physical and chemical means. In some embodiments, the GO and rGO assembly can be manufactured using aqueous processing methods, planar manufacturing methods, lamination methods, and/or roll-to-roll processes.

As described above, there can be environmental benefits of using such GO and rGO assemblies. As the GO paper 102 can be dissolved in water, the electronic components and the conductive traces 106 previously mounted to the self-supporting substrate 100 can be recovered at the end-of-life, which can greatly reduce cost and complexity of the disassembly process. The GO paper 102 generally degrades within the water to produce humic acid, which are large organic fragments that are weakly acidic. Natural humic acid is a component of humus, which is the primary constituent of peat bogs. The rGO of the GO/rGO assembly is itself a form of graphitic powder, as can be found in naturally occurring graphite ore deposits. The end-of-life products of GO and rGO assemblies are thus benign forms of earth abundant elements that can be recovered and processed without recourse to chemical processes that cause environmental and health risks such as highly hazardous acidic solvents.

Although an electronic circuit solely composed of GO and rGO has yet to be demonstrated, there are no apparent scientifically sound counter-indications why it would not work. Indeed, the rational basis supporting this hypothesis lies in that i) selective reduction techniques to reduce GO into reduced rGO are known in the art, and ii) reduced GO is known in the art to be electrically conductive. Accordingly, it is safe to assume that an electronic circuit having a self-supporting substrate having GO paper, and reduced GO provided in the form of traces could be functional. Further support was made in an experiment where laser-induced photoreduction was used to form conductive rGO traces. In this experiment, Ohmic resistivity measurements showed that the electrical resistivity of the resulting rGO traces was at least six orders of magnitude lower than the electrical resistivity of the surrounding unreduced GO paper, which is indicative that the rGO is conductive. In this experiment, although a 1064 nm, 25 W, $YVO_4$ laser was used to laser-mark the rGO traces, it is believed that other suitable laser systems can be used. Moreover, X-ray photoelectron spectroscopy (XPS) measurements were performed both on the GO paper and on the laser-induced reduced GO traces. The RPX measurements showed that the relative carbon content increased in the laser-induced reduced GO traces as compare to GO paper, and that the relative oxygen content was considerably decreased in the laser-induced reduced GO traces. The lower oxygen content of the reduced GO traces shows that the laser-induced reduction technique reduced the amount of oxygen content in the GO paper, further indicating that the traces are electrically conductive rGO. More specifically, measurements of reduction was obtained by analyzing the C 1s XPS spectrum of the reduced surface. For this experiment the XPS spectrum was obtained using the K-Alpha XPS System. Results from the XPS analysis confirmed reduction occurred as the amount of oxygen on the remaining surfaces had been more than halved in the ablation process. The carbon-to-oxygen (C/O) ratio of the original GO was 0.88 and the C/O ratio of the resulting rGO was 2.31. XPS analysis of the spaces between these reduced areas revealed a lower C/O ratio of 0.91, proving that they were unreduced. Four-point measurements carried out on independent ones of the reduced GO traces yielded large resistances beyond measurement limits, thus proving that the discrete reduced structures of the matrix cells were electrically isolated from each other. Since XPS analysis was able to resolve differences in C/O ratio between reduced and unreduced areas, the depth of reduction could be inferred to be greater than the 2-5 nm depth of penetration for XPS in this specific experiment. These results independently show promise of optical reduction as a viable technique for reducing circuit patterns into GO wafers for printed circuit applications.

Figure 4A:
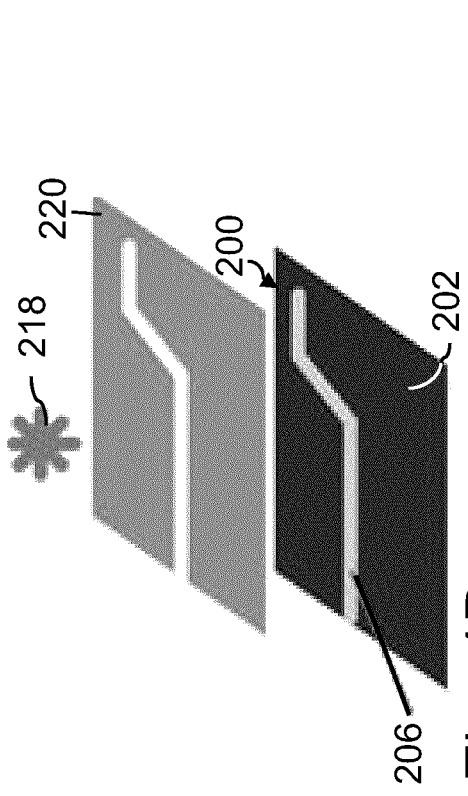
FIGS. 4A-E are oblique views of examples of self-supporting substrates having GO paper, showing reduced GO conductive traces engraved thereon using different reduction techniques, in accordance with one or more embodiments.
Figure 4B:
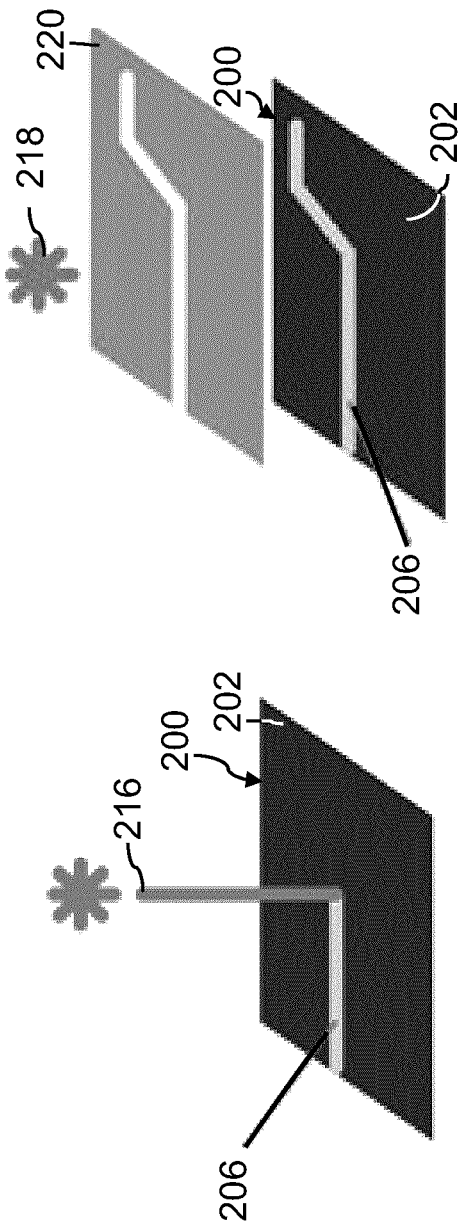
Figure 4C:
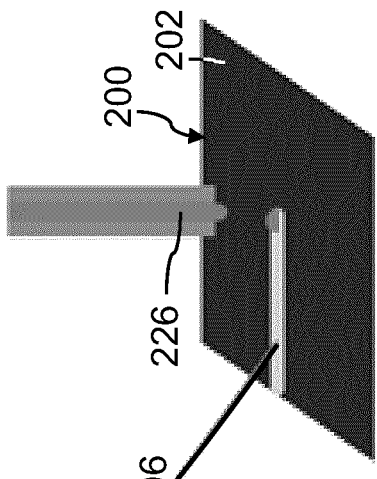
Figure 4D:
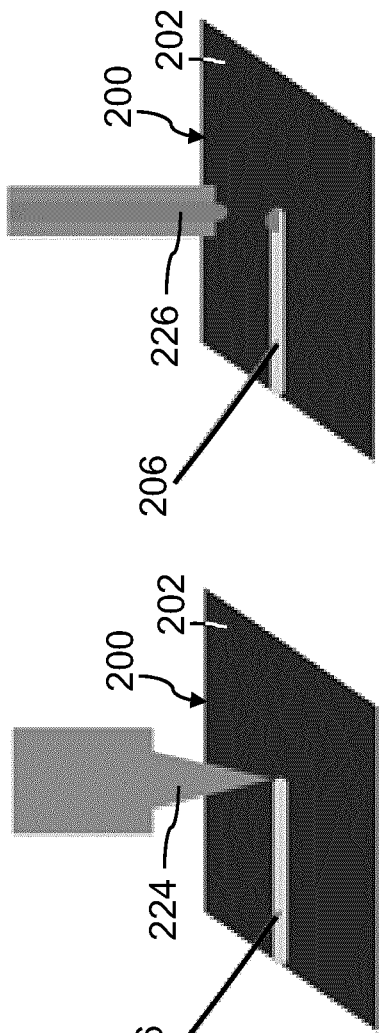
Figure 4E:
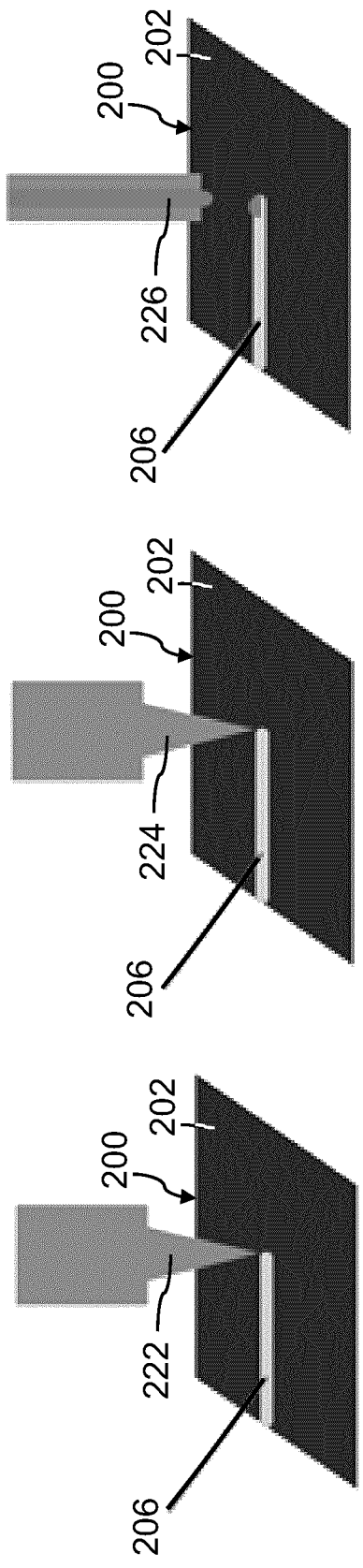

FIGS. 4A-E show examples of self-supporting substrates 200 having GO paper 202 and reduced GO conductive traces 206 engraved thereon using example techniques. More specifically, in FIG. 4A, an optical reduction beam 216 is scanned on regions of the GO paper 202, thereby optically reducing the GO paper 202 along the scanned regions to obtain one or more reduced GO conductive traces 206. In FIG. 4B, the self-supporting substrate 200 is illuminated with an optical reduction illumination source 218 via an optical mask 220, thereby optically reducing the GO paper 202 along the illuminated regions of the GO paper 202 to obtain one or more reduced GO conductive traces 206. In FIG. 4C, a hot element or thermal printing head 222 is scanned on regions of the GO paper 202, thereby thermally reducing the GO paper 202 along the scanned regions to obtain one or more reduced GO conductive traces 206. In FIG. 4D, an electrical voltage or current source 224 is scanned on regions of the GO paper 202, thereby electrically reducing the GO paper 202 along the scanned regions to obtain one or more reduced GO conductive traces 206. In FIG. 4E, a chemical source 226 is scanned on regions of the GO paper 202, thereby chemically reducing the GO paper 202 along the scanned regions to obtain one or more reduced GO conductive traces 206. For example, chemical SAR can be achieved by printing chemical reducing agents such as ascorbic acid, hydrazine, hydroiodic acid and the like.

A reduction technique may include a combination of reduction steps or methods. For example, a first step of optical SAR can be used to define an rGO electrode array on opposite sides of a GO self-supporting substrate, followed by electrical stimulus applied to selected ones of the rGO electrodes across opposite sides of the GO self-supporting substrate to selectively reduce contacts between electrodes.

As can be understood, one or more electronic circuits as the ones described herein can be connected, superposed, stacked, integrated in any manner, shape or form that is best suited for a given application. A wide variation in functionality, ease of manufacture, and ease of recovery at the end of life can be achieved with variants of the proto-typical rGO and GO assemblies described herein. Further complexity can be achieved with multi-layer assemblies, whereby multiple GO and rGO assemblies are laminated together to realize more complex functionalities with a higher degree of interconnectivity. Lamination can be achieved by bonding with adhesives, or by the process of wetting and drying to effect bonding of GO paper layers one to another. Such GO and rGO assemblies can be used to realize capacitors, mutual inductors or analogs of multi-layer PCBs.

FIG. 5A shows opposite sides of an electronic circuit 304 having a self-supporting substrate 300 having GO paper 302 and conductive traces 306. As best seen in the sectional view of FIG. 5B, one or more conductive traces 306 can be on both recto and verso sides of the self-supporting substrate 300 to form the electronic circuit 304.

FIG. 6A shows a given side of three different electronic circuit layers 430 each having a self-supporting substrate 400 having GO paper 402 and one or more conductive traces 406. As shown in the sectional view of FIG. 6B, an electronic circuit 404 having the three electronic circuit layers 430 laminated to one another can be provided in at least some embodiments. The lamination process can be achieved by bonding with adhesives, or by the use of successive wetting and drying methods to bond GO paper. Via(s) extending between the electronic circuit layers 430 can be provided using SAR or optical processing, for instance.

FIGS. 7A-D illustrate an exemplary application of an example of an electronic circuit 504, in accordance with an embodiment. As shown in FIG. 7A, conductive rows 506a are on a first side 500a of a self-supporting substrate 500. FIG. 7B shows a number of conductive columns 506b on an opposite, second side 500b of the self-supporting substrate 500. As can be understood, the conductive rows 500a are perpendicular to the conductive columns 500b in this example, as best seen in FIG. 7C. In such an embodiment, GO regions 532 of the self-supporting substrate 500 having electrically conductive material on either side can act as a memory element 534, as the resistance between the two sides 500a and 500b can be tuned via SAR.

More specifically, in this example, the conductive traces including the conductive rows and columns 506a and 506b are made of rGO. It can be understood that resistance of the GO region 532 between an rGO row 506a and an rGO column 506b can be modulated by electrical stimulation to produce a GO/rGO region of variable electrical resistance, thus forming the memory element 534 therebetween. More specifically, electrical stimulation of two conductive traces selected from a crossed array of grid electrodes on obverse sides of a GO substrate can reduce the resistance between two conductive traces. The amplitude and duration of electrical stimulation can be used to tune the degree of GO reduction, and the resulting resistance between electrodes in the cross-bar array. Operated in analog mode, such a cross-bar array can be used for weighted response in neural network architectures where reinforcement learning is implement directly by electrical or electro-thermal reduction of GO between electrically activated electrodes. Operated in digital mode, such a cross-bar array can be used as a programmable digital memory device, where each intersection in the cross-bar array contains either highly resistive GO or highly conductive rGO, as determined by the application of electrical stimulus in an initial programming phase.

Figure 8:
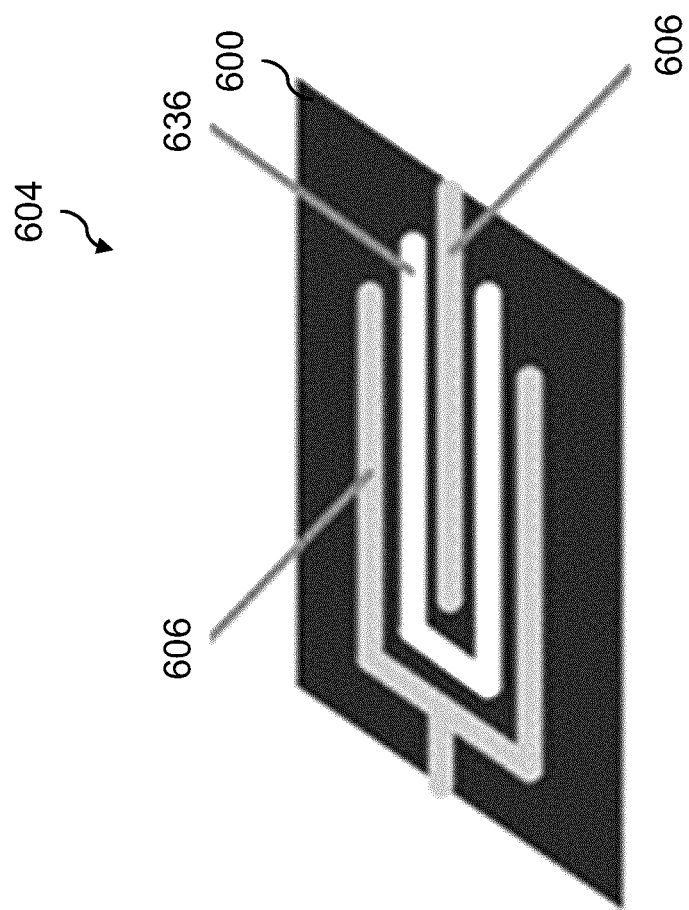
FIG. 8 is an oblique view of an example of an electronic circuit having a self-supporting substrate having GO paper, conductive traces thereon and a cut through the self-supporting substrate between the conductive traces, in accordance with one or more embodiments.

FIG. 8 shows an example of an electronic circuit 604 having a self-supporting substrate 600 having GO paper 602, conductive traces 606 on the self-supporting substrate 600, and a groove 636 recessed from the self-supporting substrate 600 between the conductive traces 606. The groove 636 can extend partially or wholly through the self-supporting substrate 600. For instance, in this specific embodiment, the groove 636 is provided in the form of a through groove, i.e., a cut extending through the self-supporting substrate 600. In this embodiment, it was found preferably to form the conductive traces 606 using an optical reduction beam, as described above. As the conductive traces 606 may be formed using an optical reduction technique such as the ones described above, the groove 636 can be created by exposing scanning a laser-engraving beam onto the self-supporting substrate 200. In some embodiments, the laser-engraving beam corresponds to the optical reduction beam with some modified parameters such as increased peak power, increased repetition rate, and the like.

Accordingly, a scanning laser can be used to either create the rGO electrically conductive trace 606 or an etched hole or groove 636 by tuning the laser power, wavelength and exposure duration. Combining both methods can allow the fabrication of electromechanical structures such as a cantilever. Moreover, electronic circuits having a pattern of SAR and material processing (e.g., cutting) can be envisaged to form electromechanical elements including but not limited to electrostatically actuated elements and electrostatic transducers. By use of a laser scanning system with control over the directed output power, one may alternatively cut and reduce a GO substrate into a GO/rGO electromechanical device, with elements such as interdigitated comb structures that can be used for both actuation of mechanical motion with electrical stimulation, and transduction of mechanical motion into electrical signals. Such devices can be used for force sensing, acceleration measurement, liquid level measurement, pressure measurement, acoustic measurement, magnetic field measurement and any other sensor that is based on electromechanical coupling to transduce the stimulus being sensed into an electrical signal.

Optical detectors can be manufactured as well. For instance, the illumination of a self-supporting substrate having GO paper by optical radiation will cause SAR to occur with a spatial pattern corresponding to the spatial distribution of the optical radiation source. The optical dose delivered can be measured by monitoring, through electrical or optical means, the reduction of GO to rGO. In its simplest form, the reduction of GO by laser exposure can reveal itself through the different visual appearance of rGO (highly reflective of light) versus GO (highly absorptive of light), such that the GO substrate acts as a dosimeter.

Example—Electronic Circuits Forming Coplanar Waveguide Transmission Lines

Figure 9B:
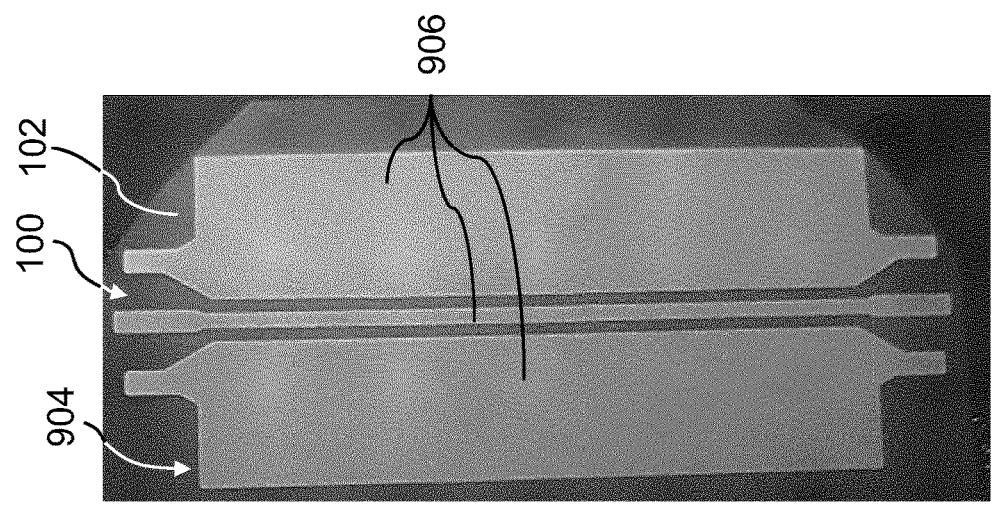
FIG. 9B is a top plan view of an example of an electronic circuit having a self-supporting substrate having GO paper, and gold traces formed thereon, showing a coplanar waveguide transmission line apparatus in a transmissive architecture, in accordance with one or more embodiments.
Figure 9A:
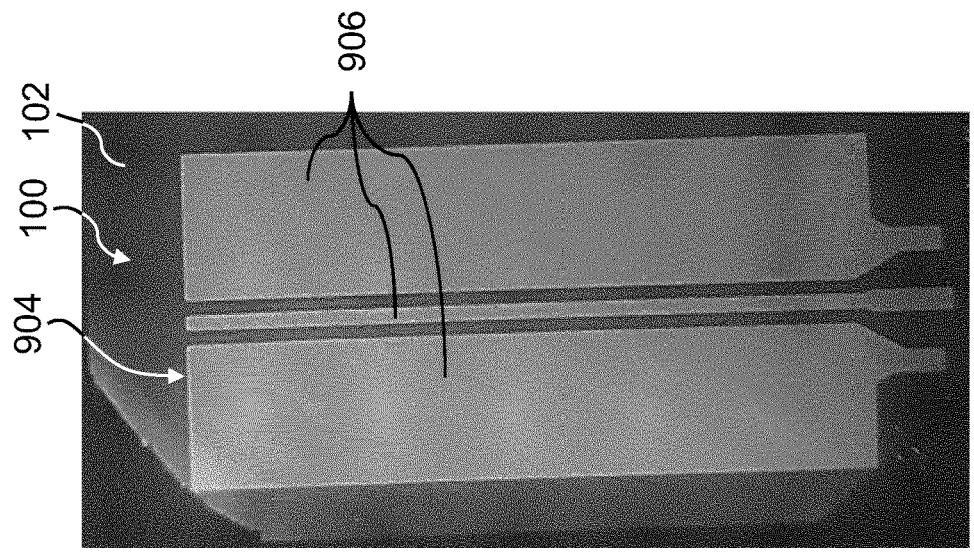
FIG. 9A is a top plan view of an example of an electronic circuit having a self-supporting substrate having GO paper, and gold traces formed thereon, showing a coplanar waveguide transmission line apparatus in a reflective architecture, in accordance with one or more embodiments.

FIGS. 9A and 9B show two different exemplary electronic circuits 904 having a self-supporting substrate 900 of GO paper 902 and Nickel conductive traces 906 received thereon, in accordance with one or more embodiments of the present disclosure. While the electronic circuit 904 of FIG. 9A shows a coplanar waveguide transmission line in a reflective architecture, FIG. 9B shows a coplanar waveguide transmission in a transmissive architecture. Pad patterns for SMA end launchers were added. Due to GO's incompatibility with soldering (soldering would reduce the GO wafer), the end launchers were bonded to the conductive portion using conductive silver paint. To reduce electromagnetic coupling effects caused by sharp corners, gradual slants were added between the SMA end launcher pad and CPW structure.

Conventional wafer fabrication procedure was used to fabricate the GO wafer for this experiment. To manufacture the conductive section of the CPW, electron beam metal vapor deposition was used. Nickel was chosen as the conductor primarily because it has a lower sublimation temperature compared to copper and gold, while having a comparable conductivity (within the same order of magnitude). Using a metal with a lower sublimation temperature reduced the risk of accidentally reducing the GO substrate during the metal deposition process. Other reasons for choosing nickel included its low cost and availability.

A vector network analyzer (VNA) with the measurement frequency range of 100 MHz to 1.8 GHz, was used to measure the scattering parameters (S-parameters) of the transmissive CPW structure shown in FIG. 9B. The effects of the SMA end launchers were calibrated away using a custom calibration kit comprising of a short, open and 50Ω through connection fabricated from high precision commercial components. During the measurement process, the GO wafer was suspended above an anodized aluminum optical breadboard surface by placing foam underneath the SMA connections. This was done to ensure that only the GO-air dielectric interface would influence the transmission line.

Figure 10:
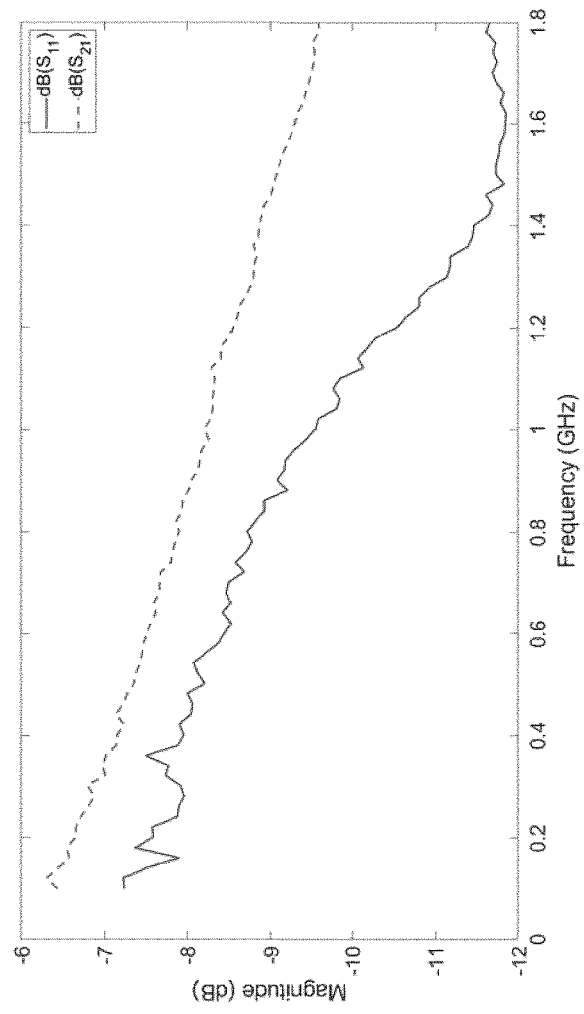
FIG. 10 is a graph showing S-parameter magnitude of the coplanar waveguide transmission line of FIG. 9B, in accordance with one or more embodiments.

The resulting S-parameters are plotted by magnitude and phase in FIG. 10. As the CPW transmission line was passive and had horizontal symmetry when viewed as in FIG. 9B, only $S_{11}$ and $S_{21}$ were measured. In this special case, $S_{12}$ and $S_{22}$ were considered and verified as equivalent to $S_{21}$ and $S_{11}$ respectively.

The measured S-parameters were converted to RLGC transmission line parameters (including $Z_0$, the characteristic impedance and $\gamma$, the complex propagation constant) using conventional techniques. Here, R is the conductor resistance per unit length, L is the inductance per unit length, G is the insulator conductance per unit length and C is the capacitance per unit length for the transmission line in an infinitesimal lumped element model.

The qualitative behaviours of both the complex characteristic impedance curve and the complex propagation constant as functions of frequency is what one would typically expect of CPW transmission lines. The magnitude of characteristic impedance of CPW transmission lines tend to decrease as frequency increases. In the case of the complex propagation constant ($\gamma$), the phase constant exhibits a linear trend, while the attenuation constant exhibits logarithmic growth and approaches a constant at higher frequencies.

The quantitative analyses pertinent to this study are those concerning loss and thus, the attenuation constant ($\alpha=\text{Re}\{\gamma\}$). $\alpha$ is a measure of loss in strength of electromagnetic power propagating through a transmission line. It is a sum different loss mechanisms, most importantly: losses within the conductor ($\alpha_c$), and losses due to the dielectric ($\alpha_d$)

The total attenuation constant is low, reaching a value below 2 dB/cm. Secondarily important is the phase constant, $\beta=\text{Im}\{\gamma\}$, which is a measure of the change in phase versus distance of an EM wave propagating through a transmission line.

In the lumped circuit model for transmission lines, the per-unit length resistance generates resistive losses in the conductor, while the per-unit length conductance generates conductive losses in the dielectric. In the low loss limit, the ratios R/ωL and G/ωC are small compared to 1. Multiplying out the terms in the right-most square root in equation 5 and ignoring the term RG/ω²LC because it is small, the complex propagation constant can be approximated by:

$$\gamma = \alpha + j\beta = \sqrt{(R+j\omega L)(G+j\omega C)} \approx j\omega\sqrt{LC} + \frac{R\sqrt{LC}}{2L} + \frac{G\sqrt{LC}}{2C} \quad (1)$$

Figure 11:
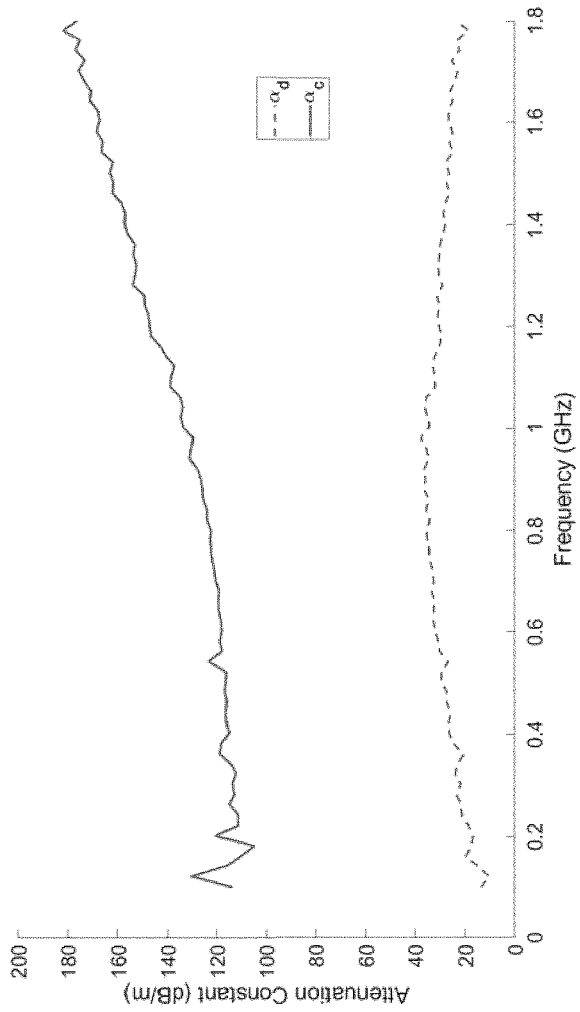
FIG. 11 is a graph showing approximate conductor and dielectric contributions to total attenuation of the coplanar waveguide transmission line of FIG. 9B, in accordance with one or more embodiments.

The ratio R/L is the attenuation caused by the conductor, while G/C is proportional to the attenuation from the dielectric. As is readily evident in FIG. 11, conductor losses are more dominant than dielectric losses. The attenuation constants have been converted to dB/m in FIG. 11.

As can be understood, the examples described above and illustrated are intended to be exemplary only. In some embodiments, the GO paper is made solely of oxidized graphene layers. In some embodiments, the GO paper can include at least 50% of oxidized graphene layers, with the remaining comprising oxidized graphene composite layers. The scope is indicated by the appended claims.

What is claimed is:

1. A method of recovering parts of an electronic circuit having a self-supporting substrate having graphene oxide (GO) paper and at least a conductive trace on said self-supporting substrate, the method comprising: immersing said electronic circuit into an environment-friendly solvent, said GO paper thereby dissociating from said conductive trace and forming a suspension within an upper layer of said environment-friendly solvent; and recovering at least one of said conductive trace and said GO paper from said environment-friendly solvent.

2. The method of claim 1 wherein said immersing said electronic circuit into an environment-friendly solvent comprises immersing said electronic circuit into water.

3. The method of claim 1 wherein said immersing comprises said conductive trace settling to a bottom layer of said environment-friendly solvent.

4. The method of claim 3 wherein said recovering comprises isolating said top layer and said bottom layer from one another and removing said at least one of said conductive trace and said GO paper from said environment-friendly solvent.

5. The method of claim 3 wherein said recovering comprises evaporating said environment-friendly solvent.

6. The method of claim 1 further comprising fabricating another electronic circuit using said recovered at least one of said conductive trace and said GO paper.

* * * * *